(12) United States Patent
Park et al.

(10) Patent No.: US 9,576,861 B2
(45) Date of Patent: Feb. 21, 2017

(54) METHOD AND SYSTEM FOR UNIVERSAL TARGET BASED INSPECTION AND METROLOGY

(71) Applicant: KLA-Tencor Corporation, Milpitas, CA (US)

(72) Inventors: Allen Park, San Jose, CA (US); Ellis Chang, Saratoga, CA (US); Michael Adel, Ya'akov (IL); Kris Bhaskar, San Jose, CA (US); Ady Levy, Sunnyvale, CA (US); Amir Widmann, Sunnyvale, CA (US); Mark Wagner, Rehovot (IL); Songnian Rong, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 16 days.

(21) Appl. No.: 14/083,126

(22) Filed: Nov. 18, 2013

(65) Prior Publication Data
US 2014/0199791 A1 Jul. 17, 2014

Related U.S. Application Data

(60) Provisional application No. 61/728,768, filed on Nov. 20, 2012.

(51) Int. Cl.
*G06F 17/50* (2006.01)
*H01L 21/66* (2006.01)

(52) U.S. Cl.
CPC .......... *H01L 22/12* (2013.01); *G06F 17/5081* (2013.01)

(58) Field of Classification Search
USPC ........................................ 716/136
See application file for complete search history.

(56) References Cited

U.S. PATENT DOCUMENTS

| | | |
|---|---|---|
| 5,805,278 A | 9/1998 | Danko |
| 6,621,570 B1 | 9/2003 | Danko |
| 6,702,302 B2 | 3/2004 | Smedt et al. |
| 6,886,153 B1 | 4/2005 | Bevis |
| 7,092,082 B1 | 8/2006 | Dardzinski |
| 7,269,816 B2 | 9/2007 | Bevis |
| 7,355,291 B2 | 4/2008 | Adel et al. |
| 7,445,945 B1 | 11/2008 | Markle et al. |
| 7,545,520 B2 | 6/2009 | Lee et al. |
| 7,570,796 B2 | 8/2009 | Zafar et al. |

(Continued)

*Primary Examiner* — Mohammed Alam
(74) *Attorney, Agent, or Firm* — Suiter Swantz pc llo

(57) ABSTRACT

Universal target based inspection drive metrology includes designing a plurality of universal metrology targets measurable with an inspection tool and measurable with a metrology tool, identifying a plurality of inspectable features within at least one die of a wafer using design data, disposing the plurality of universal targets within the at least one die of the wafer, each universal target being disposed at least proximate to one of the identified inspectable features, inspecting a region containing one or more of the universal targets with an inspection tool, identifying one or more anomalistic universal targets in the inspected region with an inspection tool and, responsive to the identification of one or more anomalistic universal targets in the inspected region, performing one or more metrology processes on the one or more anomalistic universal metrology targets with the metrology tool.

25 Claims, 11 Drawing Sheets

(56) References Cited

U.S. PATENT DOCUMENTS

| | | | |
|---|---|---|---|
| 7,676,007 | B1 | 3/2010 | Choi et al. |
| 7,711,514 | B2 | 5/2010 | Park et al. |
| 7,761,178 | B2 | 7/2010 | Tian et al. |
| 8,041,103 | B2 | 10/2011 | Kulkarni et al. |
| 8,139,843 | B2 | 3/2012 | Kulkarni et al. |
| 8,330,281 | B2 | 12/2012 | Ghinovker et al. |
| 8,702,566 | B2 | 4/2014 | Mazzanobile et al. |
| 2003/0206294 | A1* | 11/2003 | Leslie et al. ............... 356/237.2 |
| 2005/0160394 | A1* | 7/2005 | Bevis ............................. 716/19 |
| 2007/0096094 | A1* | 5/2007 | Levinski et al. ................ 257/48 |
| 2009/0082897 | A1* | 3/2009 | Cain et al. .................... 700/121 |
| 2009/0144686 | A1* | 6/2009 | Lensing et al. ................ 716/10 |
| 2010/0005442 | A1* | 1/2010 | Ghinovker et al. ............ 716/21 |
| 2011/0170091 | A1* | 7/2011 | Chang et al. ............... 356/237.5 |
| 2011/0286656 | A1 | 11/2011 | Kulkarni et al. |
| 2012/0190501 | A1 | 7/2012 | Mazzanobile et al. |

\* cited by examiner

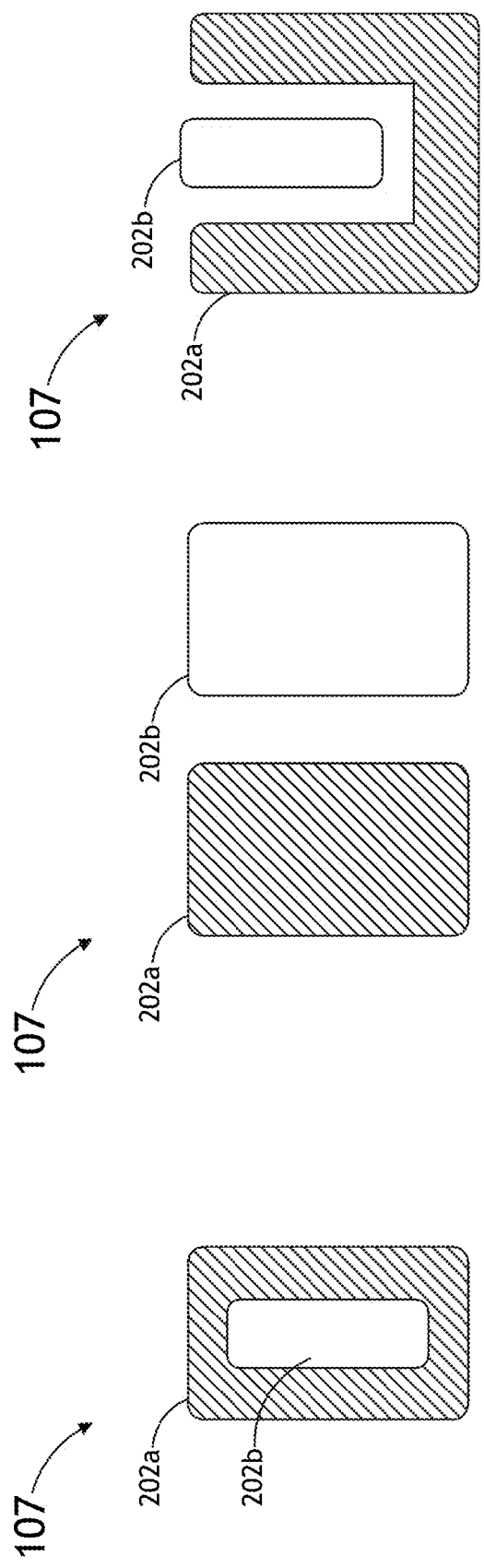

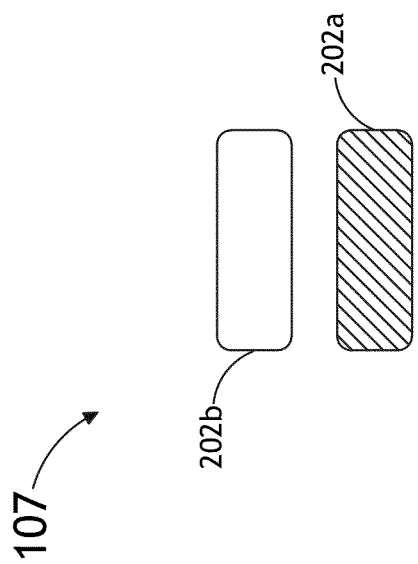
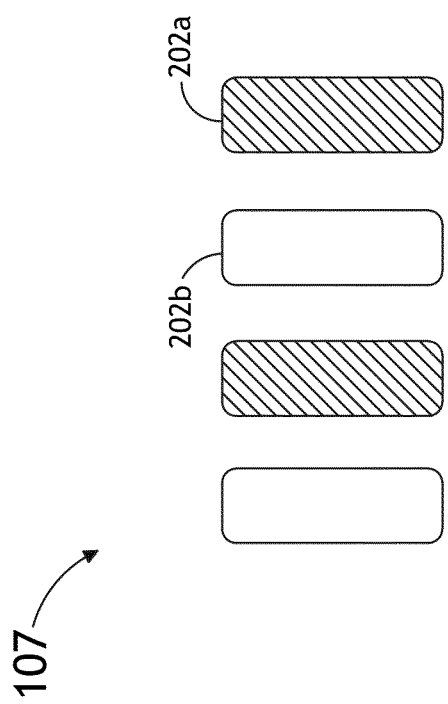

METHOD AND SYSTEM FOR UNIVERSAL TARGET BASED INSPECTION AND METROLOGY

CROSS-REFERENCE TO RELATED APPLICATION

The present application is related to and claims the benefit of the earliest available effective filing date(s) from the following listed application(s) (the "Related applications") (e.g., claims earliest available priority dates for other than provisional patent applications or claims benefits under 35 USC §119(e) for provisional patent applications, for any and all parent, grandparent, great-grandparent, etc. applications of the Related application(s)).

RELATED APPLICATIONS

For purposes of the USPTO extra-statutory requirements, the present application constitutes a regular (non-provisional) patent application of United States Provisional patent application entitled UNIVERSAL TARGET DESIGN FOR INSPECTION AND METROLOGY, naming Allen Park, Ellis Chang, Michael Adel, Kris Bhaskar, Ady Levy, Amir Widmann, Mark Wagner and Songnian Rong and as inventors, filed Nov. 20, 2012, Application Ser. No. 61/728,768.

TECHNICAL FIELD

The present invention generally relates to a method and system for inspection driven metrology.

BACKGROUND

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

As used throughout the present disclosure, the term "wafer" generally refers to substrates formed of a semiconductor or non-semiconductor material. For example, a semiconductor or non-semiconductor material may include, but are not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed. One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Inspection processes are used at various steps during a semiconductor manufacturing process to detect defects on a specimen such as a reticle and a wafer, while metrology processes are used to monitor process control (e.g., layer alignment) during device fabrication. As the dimensions of semiconductor devices decrease, inspection and metrology processes become even more important to the successful manufacture of acceptable semiconductor devices. As such, it would be advantageous to provide a system and method that provides improved wafer metrology and inspection capabilities.

SUMMARY

A method for providing in-die metrology is disclosed. In one aspect, the method may include, but is not limited to, designing a plurality of universal metrology targets measurable with an inspection tool and measurable with a metrology tool; identifying a plurality of inspectable features within at least one die of a wafer using design data; disposing the plurality of universal targets within the at least one die of the wafer, each universal target being disposed at least proximate to one of the identified inspectable features; inspecting a region containing one or more of the universal targets with an inspection tool; identifying one or more anomalistic universal targets in the inspected region with an inspection tool; and responsive to the identification of one or more anomalistic universal targets in the inspected region, performing one or more metrology processes on the one or more anomalistic universal metrology targets with the metrology tool.

A system for providing in-die metrology is disclosed. In one aspect, the method may include, but is not limited to, a lithography tool configured to: design a plurality of universal metrology targets measurable with an inspection tool and measurable with a metrology tool; identify a plurality of inspectable features within at least one die of a wafer using design data; and dispose the plurality of universal targets within the at least one die of the wafer, each universal target being disposed at least proximate to one of the identified inspectable features; an inspection tool configured to: inspect a region containing one or more of the universal targets; and identifying one or more anomalistic universal targets in the inspected region with an inspection tool; and a metrology tool configured to perform one or more metrology processes on the one or more anomalistic universal metrology targets in response to the identification of one or more anomalistic universal targets in the inspected region, wherein the lithography tool, the inspection tool and the metrology tool are communicatively coupled to a controller.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIGS. 2C through 2G are a series of conceptual views of a universal target suitable for use in the system for in-die metrology, in accordance with one embodiment of the present invention.

DETAILED DESCRIPTION OF THE INVENTION

Figure 1A:
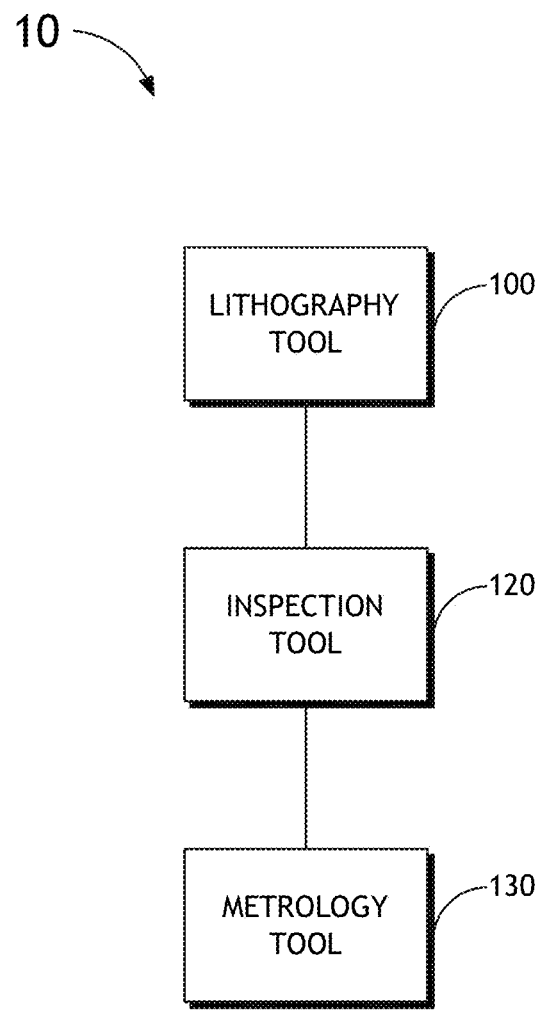
FIG. 1A is a block diagram view of a system for in-die metrology, in accordance with one embodiment of the present invention.

Reference will now be made in detail to the subject matter disclosed, which is illustrated in the accompanying drawings.

Referring generally to FIGS. 1A through 3, a method and system for universal target based inspection assisted in-die metrology are described in accordance with the present disclosure.

The implementation of overlay and CD metrology are becoming increasingly difficult due to more stringent error budget and ever shrinking design rules and multiple patterning technologies. Traditionally overlay and CD errors are often 'thrown away' as nuisance errors following inspection. It is contemplated herein that the integration of design, inspection and metrology knowledge may enable the 'recycling' of those process variations once considered nuisance. The present invention is directed, in part, to a method and system for improving detection of overlay and CD errors through better target design and target placement, combined with increased sampling.

Conventionally, inspection and metrology are conducted independently of one another with respect to target design, target placement and sampling. Overlay and CD metrology are conventionally based on targets that are pre-defined at fixed locations. Conventional inspection processes do not generally incorporate specific knowledge with respect to overlay and/or CD metrology. This is particularly true in the case of overlay metrology, where overlay sites are commonly located outside of the inspection care area.

The present invention provides for in-die metrology by overcoming placement restrictions imposed by DFM requirements, while also improving area coverage by leveraging highly sensitive inspection to detect anomalous universal metrology targets (described further herein). The present invention further enables the identification of inspection areas for lithography related errors and provides additional guidance to for purposes of non-fixed metrology sampling. In addition, it is contemplated herein that the utilization of the universal targets of the present invention on both a reticle and corresponding wafer provides for the improved ability to separate the components of the overlay/CD budget. Such an approach should result in better control and more stable correctables for use by an associated scanner. Further, the universal targets of the present invention may also be utilized for optical-SEM deskew for both wafer level and inspection swath level analysis, avoiding the redetection step and directly acquiring high magnification SEM images for automatic defect classification (ADC).

The present invention includes, in part, the design of a universal metrology target based on the consideration of the inspection and metrology applications. In addition, the present invention includes, in part, the insertion of the universal targets during design layout of the one or more devices of a wafer in order to comply with DFM rules. Further, the present invention includes the utilization of the universal targets to measure and communicate among inspection, CD and OVL metrology tools. Moreover, the universal targets of the present invention are designed in a manner to protection the device pattern density required by the one or more devices of the wafer by arranging and configuring targets during the circuit layout process. Further, the use of design data may aid in identifying regions of one or more die of a wafer in which to apply a high sampling rate during inspection, while inspection results may further aid in identifying regions suitable for reduced or increased metrology sampling. In addition, the present invention implements the utilization of a design search to identify existing patterns that are friendly to Inspection, Review and CD Metrology.

FIG. 1A illustrates a system 10 for universal target based inspection and metrology, in accordance with one embodiment of the present invention. It is contemplated herein that system 10 is suitable for carrying out one or more of the various processes described throughout the present invention. In one embodiment, the system 10 includes, but is not limited to, a lithography tool 100, an inspection tool 120 and a metrology tool 130. In one embodiment, the system 10 may design a set of universal metrology targets suitable for measurement with an inspection tool and metrology tool (e.g., overlay metrology tool or CD metrology tool). In addition, the system 10 may identify a set of inspectable, or inspection "friendly," features within one or more die of a wafer. Based on the identification of the set of inspectable features, the system 10 (e.g., using lithography tool 100) may dispose (e.g., lithographically print) a set of universal target structures, consistent with the universal target design, at or near the identified inspectable features. Then, utilizing the inspection tool 120, the system 100 may inspect a region containing one or more of the printed universal targets. In turn, the system 10 may identify one or more anomalistic targets exhibiting an inspection parameter (e.g., inspection signal) outside an expected value (e.g., deviating from average inspection parameter, deviating from historical inspection signal and the like). The system 10 may then perform one or more metrology process on the identified anomalistic universal targets. Further, the system 10 may provide for increased metrology sampling at regions with high numbers of anomalies, while reducing metrology sampling in regions with low number of anomalies (as identified by inspection). Further, it is contemplated herein that the inspection signals measured using inspection tool 120 may be calibrated utilizing the subsequent metrology results. In this regard, the calibration of inspection data may allow the inspection signal of the universal targets to serve as a proxy for direct metrology measurements.

Figure 1B:
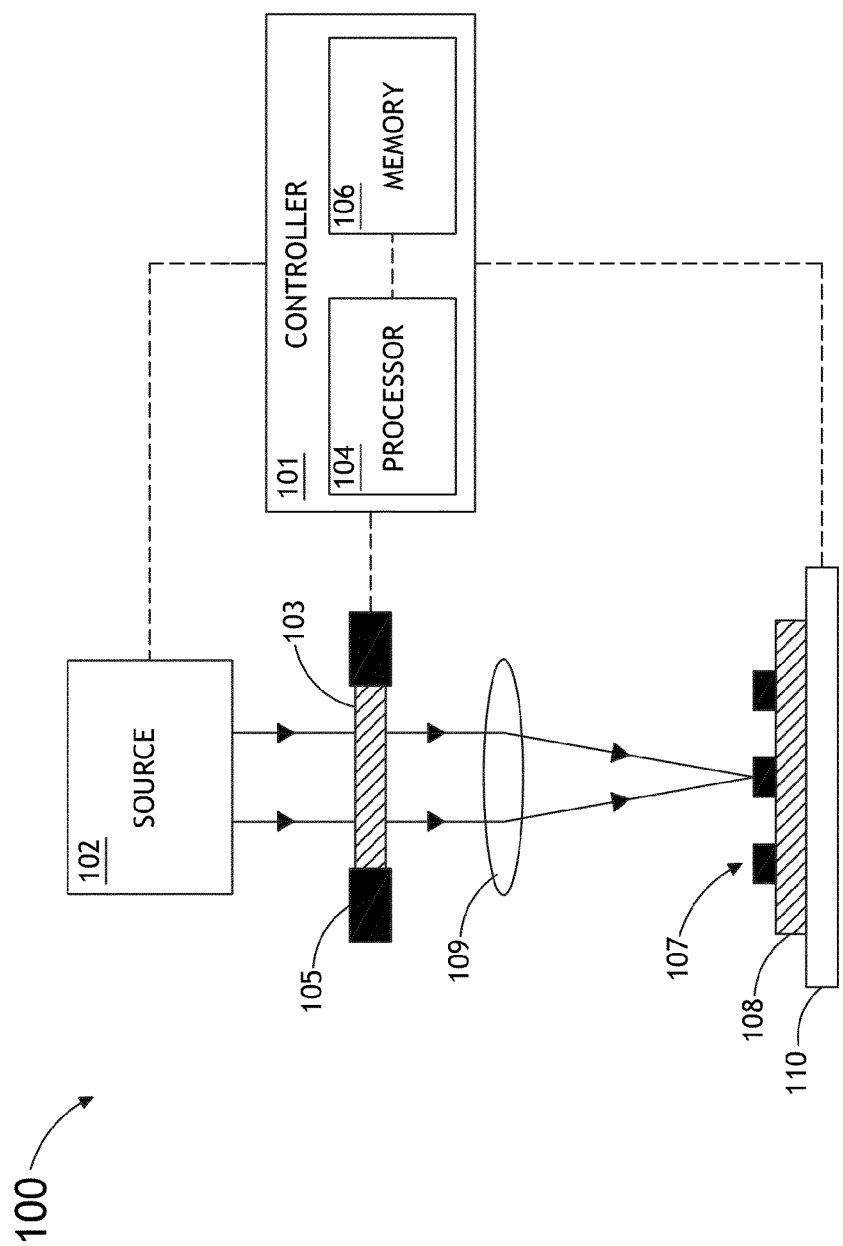
FIG. 1B is a block diagram view of a lithography tool of the system for in-die metrology, in accordance with one embodiment of the present invention.

FIG. 1B illustrates a simplified schematic view of a lithography tool 100 suitable for implementation in the system 10, in accordance with one embodiment of the present invention. In one embodiment, the lithography tool 100 consists of a lithographic printing tool 100. The lithographic printing tool 100 may include any lithographic printing tool known in the art. For example, the lithographic printing tool 100 may include, but is not limited to, a scanner or stepper. In another embodiment, the lithographic printing tool 100 may include a radiation source 102. The radiation source 102 may include any radiation source known in the art suitable for carrying out a lithographic based printing process. For example, the radiation source 102 may include, but is not limited to, an UV, EUV or DUV light source.

In another embodiment, the lithographic printing tool 100 includes a mask support device 105. The mask support device 105 is configured to secure a pattern mask 103. In this regard, the support device 103 may hold the mask 103 utilizing any means known in the art, such as, but not limited to, mechanical, vacuum, electrostatic or other clamping techniques. In another embodiment, the pattern mask 103 is positioned in the illumination path of the lithographic printing tool 100, between the radiation source 102 and the wafer 108 disposed on wafer stage 110. Further, the support device 105 may be configured to actuate or position the pattern mask 103. For example, the support device 105 may actuate the pattern mask 103 to a selected position with respect to the projection optics 109 of the lithography tool 100. In another embodiment, the projection optics 109 of the lithography tool 100 may act to project the transmitted pattern onto the resist material of wafer 108, thereby transferring the mask pattern to the wafer 108.

In another embodiment, a computer controller 101 may control the various sub-systems of the lithography tool 100 in any manner known in the art. In another embodiment, the computer controller 101 may serve as a computation system and may include one or more processors 104 configured to execute program instructions maintained on a non-transitory medium 106 (i.e., memory). In this regard, the one or more processors of controller 101 may execute any of the various process steps described throughout the present invention. It is noted herein that the lithographic printing tool 100 of the present invention may implement any mask design necessary to generate the universal targets described throughout the present disclosure (see, e.g., FIGS. 2A-2G). Lee et al. generally describe mask-based lithography in U.S. Pat. No. 7,545,520, issued on Jun. 9, 2009, which is incorporated herein by reference in the entirety.

In one embodiment, the controller 101 is configured to carry out one or more design steps in order to design one or more universal targets 107 of the present invention. In one embodiment, the controller 101 (or any other computational system) may design a plurality of universal metrology targets 107 simultaneously compatible (i.e., measurable with) an inspection tool and a metrology tool (e.g., overlay metrology tool, CD metrology tool and the like).

In one embodiment, the one or more processors 104 of controller 101 execute one or more design steps to generate a plurality of universal metrology targets 107 measurable using an overlay metrology tool. It is noted herein that any overlay metrology tool architecture known in the art may be adapted to operate in the present invention. In this regard, the metrology tool 131 described further herein may be configured generally as an overlay metrology tool for measuring overlay between two or more target structures (e.g., 202a and 202b).

In another embodiment, the one or more processors 104 of controller 101 execute one or more design steps to generate a plurality of universal metrology targets 107 measurable using a CD metrology tool. It is noted herein that any CD metrology tool architecture known in the art may be adapted to operate in the present invention. In this regard, the metrology tool 131 described further herein may be configured generally as a CD metrology tool for measuring a critical dimension associated with one or more target structures (e.g., 202a and 202b). In another embodiment, when operating in a mask metrology configuration, the universal targets 107 may be designed to allow for measuring critical dimension uniformity (CDU) and registration.

In one embodiment, the one or more processors 104 of controller 101 of lithography tool 100 execute one or more design steps to design a plurality of universal targets 107 configured to satisfy a design for manufacturability (DFM) requirement of one or more devices fabricated on the wafer 108. In another embodiment, the one or more processors 104 of controller 101 execute one or more design steps to achieve adequate (e.g., above a selected threshold level) inspection detection during run-time alignment. In another embodiment, the designed plurality of universal metrology targets are configured for imaging by a scanning electron microscope (SEM).

In another embodiment, the one or more processors 104 of controller 101 generate a plurality of universal metrology targets 107 suitable for achieving a selected device pattern density. In one embodiment, the one or more processors 104 of controller 101 generate a plurality of universal metrology targets, wherein an arrangement of the universal targets 107 and active circuit layout of one or more devices of the wafer 108 are at or above a selected device pattern density. In this regard, the universal targets 107 may act as "smart fill" in order to comply with a pattern density requirement associated with the one or more devices of the wafer 108.

While the design of the universal targets 107 has been described in the context of controller 101 of lithography tool 100, it is contemplated herein that any computational system or sub-system perform the universal target design step of the present invention. For example, the design step may be carried out using a stand-alone computational system (e.g., one or more processors executing program instructions stored in memory). By way of another, the design step may be carried out using any one of the other controllers of the present invention (e.g., controller 121, 131 or 141). By way of another, the design step may be carried out using an integrated controller serving to control two or more of the systems 100, 120, 130 and 140.

In another embodiment, the controller 101 is configured to carry out one or more feature identification steps in order to identify a plurality of inspectable features within one or more die of the wafer 108. In one embodiment, the controller 101 may utilize design data associated with the circuit layout of one or more devices of the wafer 108 in order to identify a set of inspectable features within on or more die of the wafer 108. In another embodiment, the controller 101 may execute a design search of design data associated with the circuit layout of one or more devices of the wafer 108 in order to identify a set of inspectable features within on or more die of the wafer 108. In another embodiment, the controller 101 may execute a design search of design data associated with the circuit layout of one or more devices of the wafer 108 in order search for one or more patterns in the design data that are suitable or inspection, overlay metrology and/or CD metrology. In another embodiment, the controller 101 may utilize design data associated with the circuit layout of one or more devices of the wafer 108 in order to identify one or more spatial configurations (e.g., positions of the universal targets) within one or more die 111 at which placement of the universal targets 107 satisfies a design for manufacturability (DFM) requirement.

The term "design data" as used in the present disclosure generally refers to the physical design of an integrated circuit and data derived from the physical design through complex simulation or simple geometric and Boolean operations. In addition, an image of a reticle acquired by a reticle inspection system and/or derivatives thereof may be used as a proxy or proxies for the design data. Such a reticle image or a derivative thereof may serve as a substitute for the design layout in any embodiments described herein that uses design data. Design data and design data proxies are described in U.S. Pat. No. 7,676,007 by Kulkarni issued on Mar. 9, 2010; U.S. patent application Ser. No. 13/115,957 by Kulkarni filed on May 25, 2011; U.S. Pat. No. 8,041,103 by Kulkarni issued on Oct. 18, 2011; and U.S. Pat. No. 7,570, 796 by Zafar et al. issued on Aug. 4, 2009, all of which are incorporated herein by reference. Further, the use of design data in directing inspection processes is described generally in U.S. patent application Ser. No. 13/339,805 to Park, filed on Feb. 17, 2012, which is incorporated herein by reference in the entirety It is recognized herein that the design and identification steps described above and further herein need not be carried out by the controller 101 of lithography tool 100. It is contemplated herein that the universal target design step and the inspectable feature identification step of the present invention may be carried out by any computational system or sub-system known in the art. For example, these steps may be carried out by a stand-alone computational system (not shown). By way of another example, these steps may be carried out by any system or sub-system of system 10 (e.g., inspection tool 120, metrology tool 130 and the like).

In another embodiment, the lithography tool 100 is configured to dispose a plurality of universal targets within one or more die of the wafer 108. In one embodiment, radiation source 102 (e.g., UV source) may transmit light through the mask 103 such that light is selectively transmitted to the resist layer of wafer 108, thereby forming the universal targets 107 at locations within one or more die of the wafer 108 proximate to (e.g., at or near) the identified inspectable features. As shown in FIGS. 1B and 1C, the lithography tool 100 may print a set of universal target structures 107 within one or more die 111 of wafer 108. In this regard, the position of each of the universal target structures 107 printed in a given die or dies is based on the identification of regions of the device features of the wafer 108 suitable for inspection. In one embodiment, the lithography tool 100 may dispose the plurality of universal metrology targets 107 and one or more active circuit elements within the at least one die 111 of the wafer 108 such that a pattern density associated with the active circuit layout of the one or more devices of the wafer is at or above a selected device pattern density.

Figure 1D:
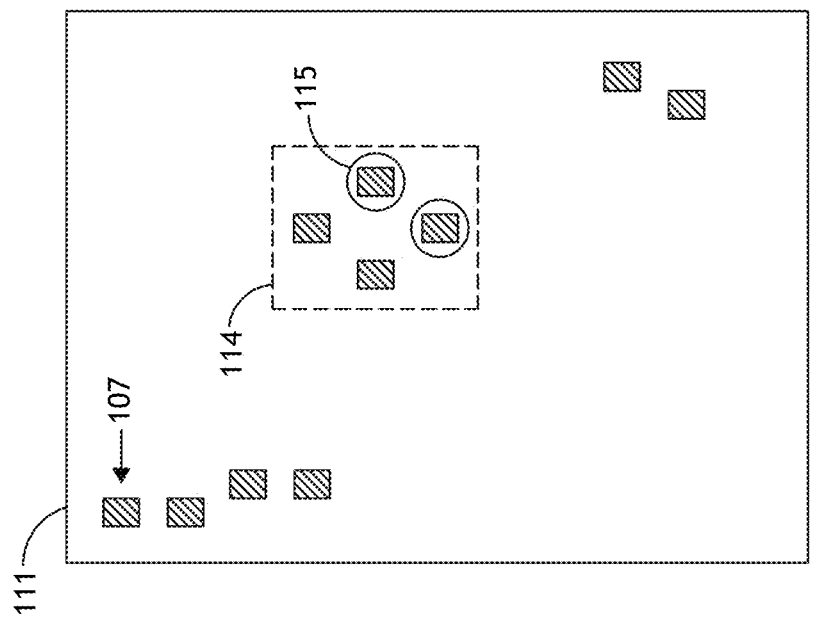
FIG. 1D is a top view of a die of a wafer including a set of universal targets and a corresponding inspection region, in accordance with one embodiment of the present invention.
Figure 1C:
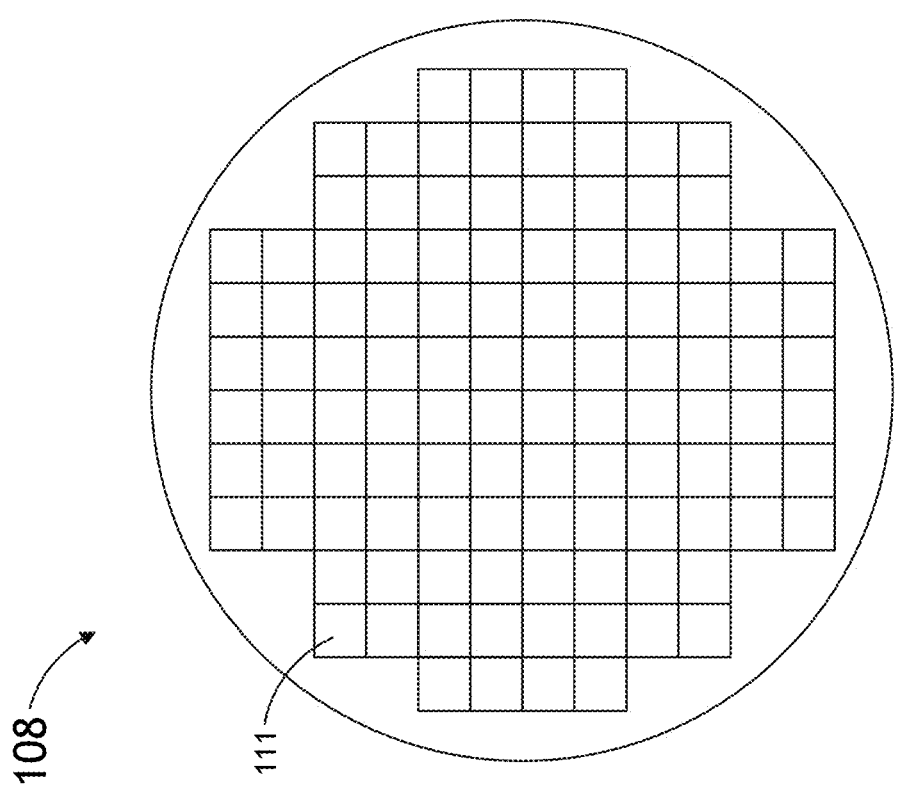
FIG. 1C is a top view of a wafer including a set of die, in accordance with one embodiment of the present invention.
Figure 1E:
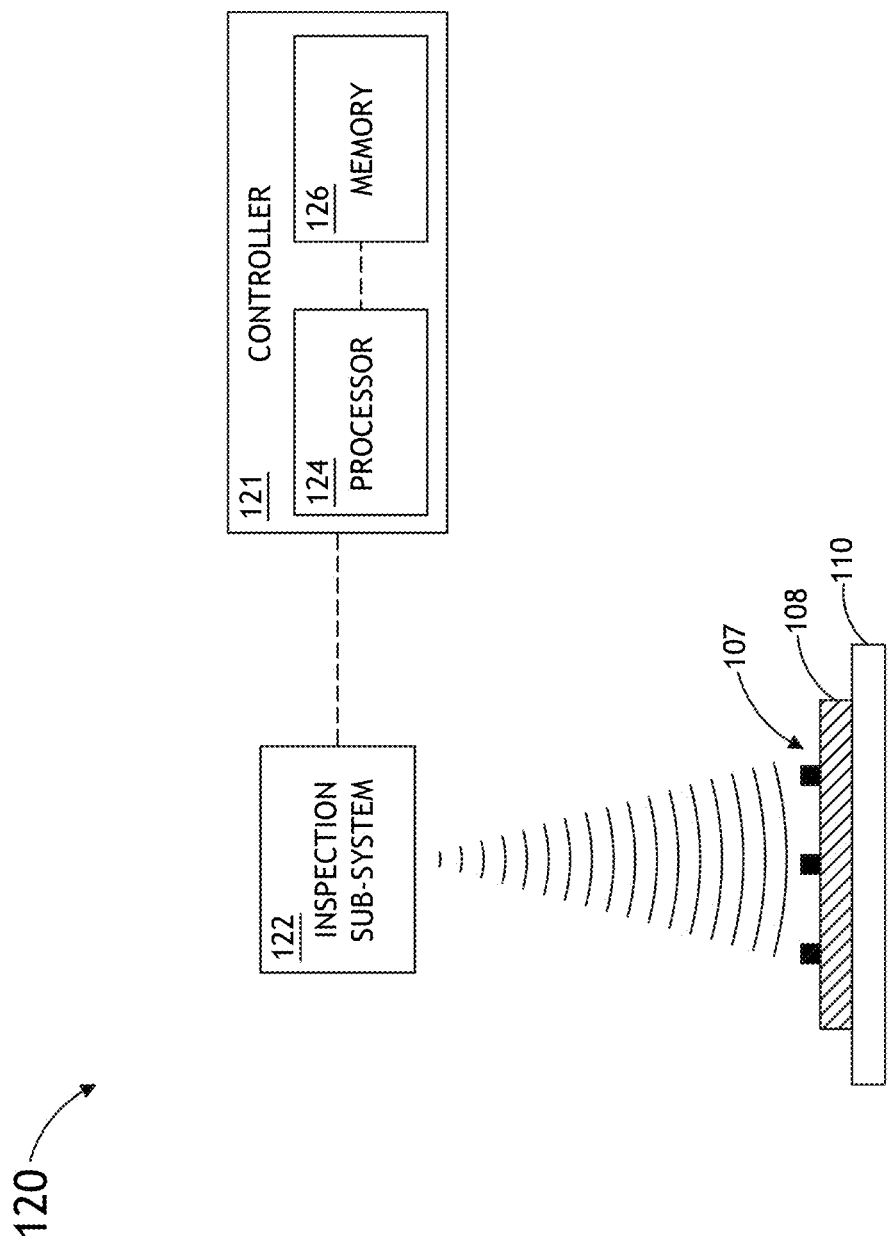
FIG. 1E is a block diagram view of an inspection tool of the system for in-die metrology, in accordance with one embodiment of the present invention.

FIG. 1E illustrates an inspection tool 120 suitable for implementation in the system 10, in accordance with one embodiment of the present invention. In one embodiment, the inspection tool 120 is configured to detect defects on a semiconductor wafer 108 disposed on the sample stage 110. The inspection tool 120 may include any appropriate inspection tool or system known in the art, such as, but not limited to, an optical inspection tool or an electron beam inspection tool. For example, in the case of an optical inspection, the inspection tool 120 may include, but is not limited to, a bright-field inspection tool, or a dark-field inspection tool. In another embodiment, the inspection of one or more universal targets contained within a selected region may be carried out utilizing the imaging function of a scanning electron microscope (SEM). In another embodiment, the inspection tool 120 may include an inspection sub-system 122 (i.e., inspection optical sub-system), a wafer stage 110 and controller 121. In a further aspect, although not shown, the inspection sub-system 122 may include an illumination source, a detector and various optical components for performing inspection (e.g., lenses, beam splitters and the like). The illumination source may include any illumination source known in the art. For example, the illumination source may include a narrow band light source, such as a laser source. In a further embodiment, the illumination source may be configured to direct light to surface of the wafer 108 (via various optical components) disposed on the sample stage 110. Further, the various optical components of the inspection sub-system 122 of inspection tool 120 are configured to direct light reflected and/or scattered from the surface of an inspection region of the wafer 108 to the detector of the inspection sub-system 122.

The detector may include any appropriate detector known in the art. In one embodiment, the detector may include a charge coupled device (CCD) camera. The detector may be used to detect actual defects (e.g., defects) on wafer 108. In a further embodiment, the output of the detector may be communicatively coupled to the controller 101. In this regard, the controller 121 may be configured to detect actual defects on wafer 108 using detection data collected and transmitted by the detector. The controller 121 may utilize any method and/or algorithm known in the art to detect defects on the wafer. Those skilled in the art should recognize that the inspection tool 120 may be utilized to detect defects distributed across the semiconductor wafer.

Further, the controller 101 may be coupled to the detector in any suitable manner (e.g., by one or more transmission media indicated by the dotted line shown in FIG. 1A) such that the controller 121 can receive the output generated by the detector. Furthermore, if the inspection sub-system 122 includes more than one detector (not shown), the controller 121 may be coupled to each detector as described above. In a further embodiment, the wafer 108 may be disposed on a sample stage 110. The sample stage 110 may include any appropriate mechanical and/or robotic assembly known in the art. Examples of currently available wafer inspection tools are described in detail in U.S. Pat. No. 7,092,082, U.S. Pat. No. 6,702,302, U.S. Pat. No. 6,621,570 and U.S. Pat. No. 5,805,278, which are each herein incorporated by reference in the entirety.

In a further embodiment, the inspection tool 120 may be configured to accept instructions from another subsystem of the system 10. For instance, the inspection tool sub-system 122 of inspection tool 120 may accept instructions from the controller 121 of system 100. Upon receiving the instructions from the controller 121, the inspection sub-system 122 may perform an inspection process at the locations of the semiconductor wafer 108 identified in the provided instructions (i.e., the inspection recipe). The controller 121 may further be configured to perform any other step(s) of any of the method embodiments described herein. In another embodiment, the inspection tool sub-system 122 may accept instructions from any other controller of the system 10, such as controller 121, 131 and/or 141.

In another embodiment, the controller 121 of the inspection tool 120 may be configured to receive and/or acquire data or information from other systems (e.g., inspection results from an inspection system or metrology results from a metrology system) by a transmission medium that may include wireline and/or wireless portions. In this manner, the transmission medium may serve as a data link between the one or more controllers 121 and other subsystems (e.g., lithography system 100, metrology system 130 and the like) of the system 10. Moreover, the controller 121 may send data to external systems via a transmission medium (e.g., network connection).

In one embodiment, the inspection tool 120 is configured to inspect a selected region of a die 111 of wafer 108 containing one or more of the universal targets 107. For example, as shown in FIGS. 1B and 1C, the inspection tool 107 may inspect region 114 containing the universal targets 107 printed near the identified inspectable features of the one or more devices of wafer 108. In another embodiment, the shape and/or size of the inspection region 114 may be selected in order to achieve sensitivity at or above a select level. In this regard, a region may be selected so as to maximize or minimize a given inspection parameter (e.g., time of inspection, accuracy of inspection and the like) of the inspection tool 120.

In another embodiment, following inspection of the region 114, the controller 121 of inspection tool 120 may identify one or more anomalistic universal targets 115, as shown in FIG. 1D. In one embodiment, the one or more processors 124 of the inspection tool 120 may execute an imaging processing algorithm suitable for detecting anomalistic universal targets 115 (i.e., universal targets displaying a higher or lower than anticipated or average inspection signal intensity).

Figure 1F:
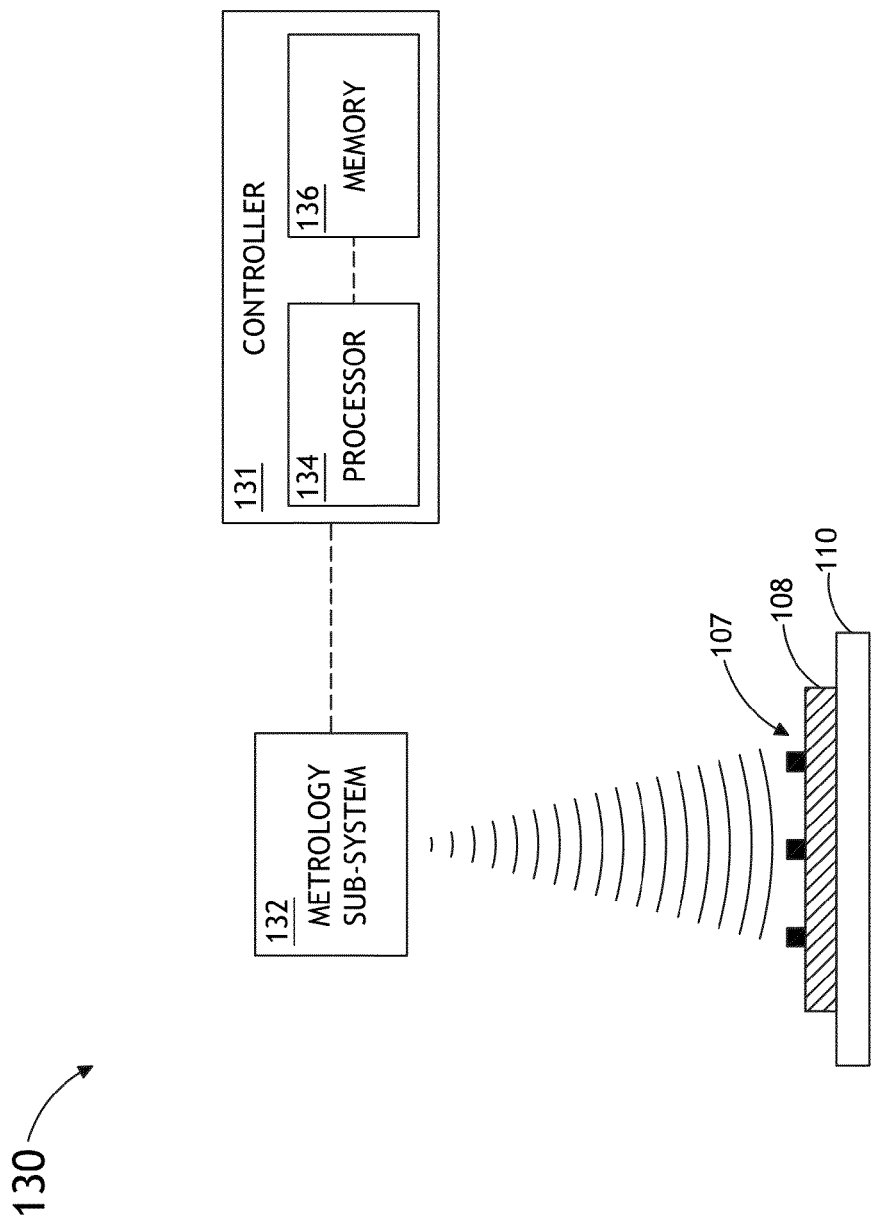
FIG. 1F is a block diagram view of a metrology tool of the system for in-die metrology, in accordance with one embodiment of the present invention.

FIG. 1F illustrates a metrology tool 130 suitable for implementation in the system 10, in accordance with one embodiment of the present invention. In one embodiment, metrology tool 120 includes a metrology sub-system 132 (i.e., optical sub-system). In one embodiment, the metrology sub-system 132 may include, but is not limited to, an illumination source (not shown), a detector (not shown) and set of illumination and collection optics suitable for directing light onto one or more anomalistic universal targets 115 (identified by the inspection tool 120) of the wafer 108 and, in turn, collecting scattered or reflected for detection by the detector. It is contemplated herein that the metrology tool 130 of the present invention may include any overlay metrology tool or critical dimension metrology tool known in the art. In another embodiment, the metrology tool 130 includes a controller 131 equipped with one or more processors 134 and memory 136. In this regard, the metrology controller 131 may receive measurement data from the detector of the metrology tool 130 and execute one or more metrology (e.g., overlay or CD metrology) algorithms in order to determine one or more parameters (e.g., overlay error, critical dimension and the like) of the analyzed anomalistic universal target structures 115. Adel et al. generally describes techniques for measurement and calculation of overlay with respect to overlay targets in U.S. Pat. No. 7,355,291, issued on Apr. 8, 2008, which is incorporated herein by reference in the entirety. Measurement, calculation and fabrication techniques with respect to overlay metrology targets are described in U.S. Pat. No. 8,330,281, issued on Dec. 11, 2012, which is incorporated herein by reference in the entirety.

In one embodiment, the metrology tool 130 may perform one or more metrology processes on one or more universal metrology targets 107 at least proximate to the anomalistic universal metrology targets 115 identified with inspection tool 120. In one embodiment, as shown in FIG. 1A, the inspection tool 120 is communicatively coupled to the metrology tool 130. In this regard, the inspection results acquired by inspection tool 120 may be fed forward to the metrology tool 130. It is noted herein that in some embodiments the inspection tool 120 and metrology tool 130 may be integrated such that they share a controller 141, which includes processors 144 and memory 146. In other embodiments, the controller 121 of the inspection tool 120 is communicatively coupled to the controller 131 of the metrology tool 130.

In one embodiment, a metrology tool 130 may perform one or more metrology measurements on one or more of the anomalistic universal targets 115 identified by the inspection system 120. In this regard, the metrology process performed on a given wafer may be fined tuned by the pre-selection of measurement targets via inspection and inspection signal anomaly identification.

In one embodiment, the metrology process may include one or more overlay metrology processes. It is noted herein that any overlay metrology tool known in the art is adaptable to the present invention. In another embodiment, the metrology process may include a CD metrology process. It is noted herein that any CD metrology tool known in the art is adaptable to the present invention.

In another embodiment, one or more inspection results of one or more universal target structures may be calibrated with one or more results of the performed one or more metrology processes. In this regard, the results of the metrology processes performed on the anomalistic and non-anomalistic universal targets may be utilized to calibrate the inspection signal acquired from the anomalistic and non-anomalistic universal targets.

Figure 1G:
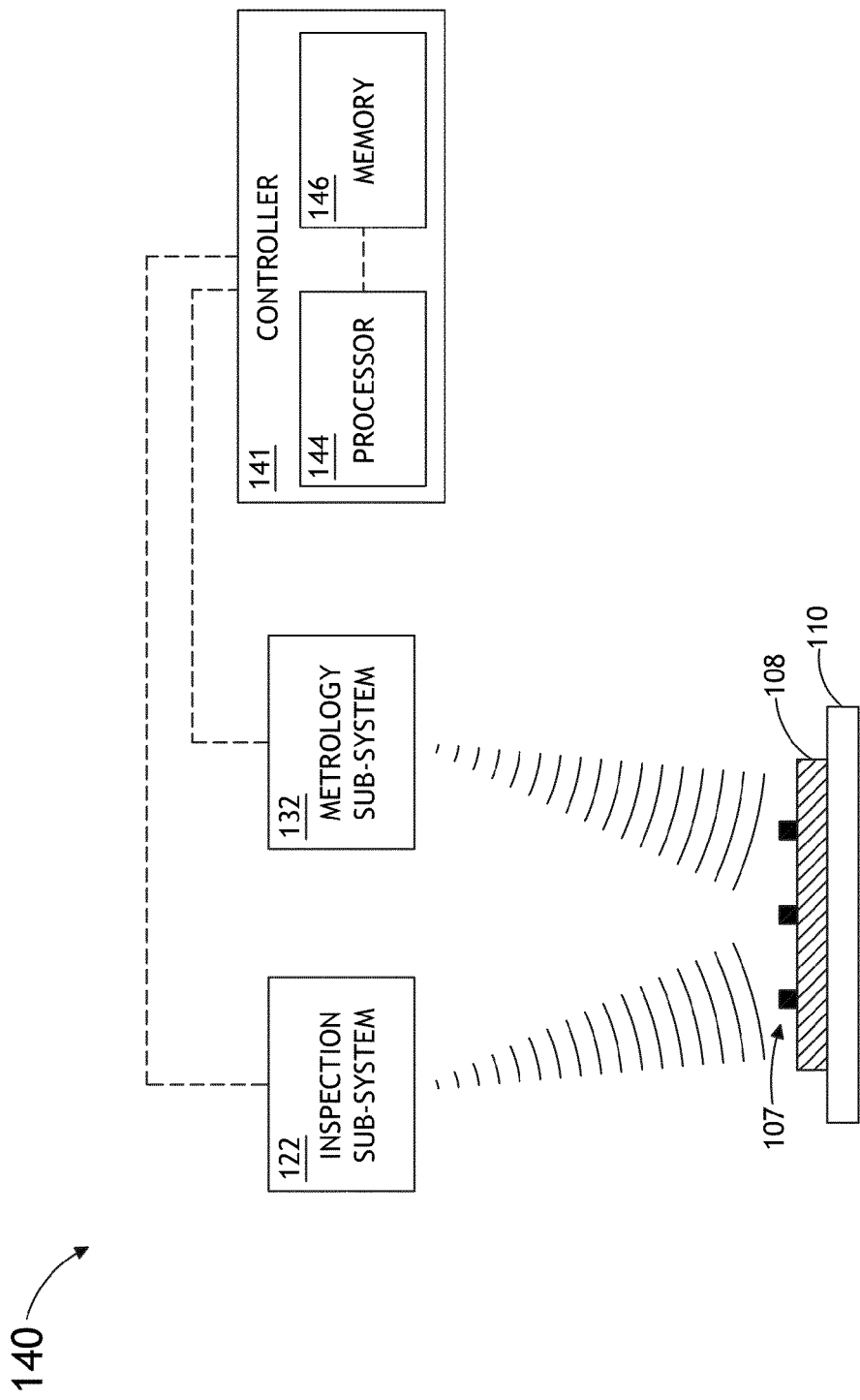
FIG. 1G is a block diagram view of an integrated inspection-metrology tool of the system for in-die metrology, in accordance with one embodiment of the present invention.

FIG. 1G illustrates an integrated inspection-metrology tool 140 for implementation in the system 10, in accordance with on embodiment of the present invention. While the present disclosure has focused on the implementation of the present invention in the context of separate inspection and metrology tools, it is contemplated herein that the inspection sub-system 122 and metrology sub-system 132 of the present invention may be integrated into a common system architecture 140, as shown in FIG. 1G. In a further embodiment, the integrated inspection-metrology tool 140 may include a common controller 141 equipped with one or more processors 144 and memory 146.

The one or more controllers of the present invention (e.g. controller 101, 121, 131 and 141) may include, but are not limited to, one or more processors (e.g., 104, 124, 134 and 144). In another embodiment, the controllers of the present invention may include a non-transitory medium (i.e., memory medium) in communication with the one or more processors. In another embodiment, the memory medium (e.g., 106, 126, 136 and 146) include program instructions for causing the one or more processors to carry out the various steps described through the present disclosure.

The one or more processors of the controllers may include any one or more processing elements known in the art. In this sense, the one or more processors may include any microprocessor-type device configured to execute software algorithms and/or instructions. In one embodiment, the one or more processors may consist of a desktop computer, mainframe computer system, workstation, image computer, parallel processor, or other computer system (e.g., networked computer) configured to execute a program configured to operate the system or sub-systems of the present invention, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium. Moreover, different subsystems of the system 10 may include a processor or logic elements suitable for carrying out at least a portion of the steps described throughout the present disclosure. Therefore, the above description should not be interpreted as a limitation on the present invention but merely an illustration The memory media of the present invention may include any storage medium known in the art suitable for storing program instructions executable by the associated one or more processors. For example, the memory media may include, but are not limited to, a read-only memory, a random access memory, a magnetic or optical memory device (e.g., disk), a magnetic tape, a solid state drive and the like. In another embodiment, it is noted herein that the memory is configured to store one or more results from the various sub-systems and/or the output of the various steps described herein. It is further noted that memory may be housed in a common controller housing with the one or more processors. In an alternative embodiment, the memory may be located remotely with respect to the physical location of the processors and controllers. For instance, the one or more processors 104 of controller 104 may access a remote memory (e.g., server), accessible through a network (e.g., internet, intranet and the like).

The universal targets of the present invention may take on a variety of spatial configurations. In general any spatial configuration may be suitable for use in the target design provide it meets the requirements set forth in the present disclosure (e.g., pattern density requires, DFM requirements, inspection compatible, metrology compatible and the like). It is recognized that the particular design implemented may be chosen in order to satisfy all or some of the above requirements. In selecting a universal target design a number of spatial parameters are relevant. These spatial parameters include, but are not limited to, area, width, orientation and shape.

In one embodiment, one or more universal targets include a first metrology target structure disposed on a first process layer and at least a second metrology target disposed on a second process layer, wherein a shift along at least one direction between the first metrology target structure and the at least a second metrology target structure is measurable by an overlay metrology tool.

In another embodiment, the one or more universal targets include a first metrology target structure including a set of diagonal target structure elements and at least a second metrology target structure including a set of diagonal target structure elements, wherein a shift along at least one direction between the first metrology target structure and the at least a second metrology target structure is measurable by an overlay metrology tool.

In another embodiment, the one or more universal targets include a first metrology target structure disposed on a first process layer having a first size; and at least a second metrology target disposed on a second process layer having a second size different than the first size, wherein a shift along at least one direction between the first metrology target structure and the at least a second metrology target structure is measurable by an overlay metrology tool.

In another embodiment, the one or more universal targets include a first metrology target structure disposed on a first process layer having a first shape and at least a second metrology target disposed on a second process layer having a second shape different than the first size, wherein a shift along at least one direction between the first metrology target structure and the at least a second metrology target structure is measurable by an overlay metrology tool.

In another embodiment, the one or more universal targets include a first metrology target structure disposed on a process layer and at least a second metrology target disposed on the process layer (same process layer as first target structure), wherein a size difference between the first metrology target structure and the at least a second metrology target structure is measurable by a CD metrology tool.

In another embodiment, the one or more universal targets include a first metrology target structure disposed on a process layer and at least a second metrology target disposed on the process layer (same process layer as first target structure), wherein a position difference between the first metrology target structure and the at least a second metrology target structure is measurable by a CD metrology tool.

Figure 2A:
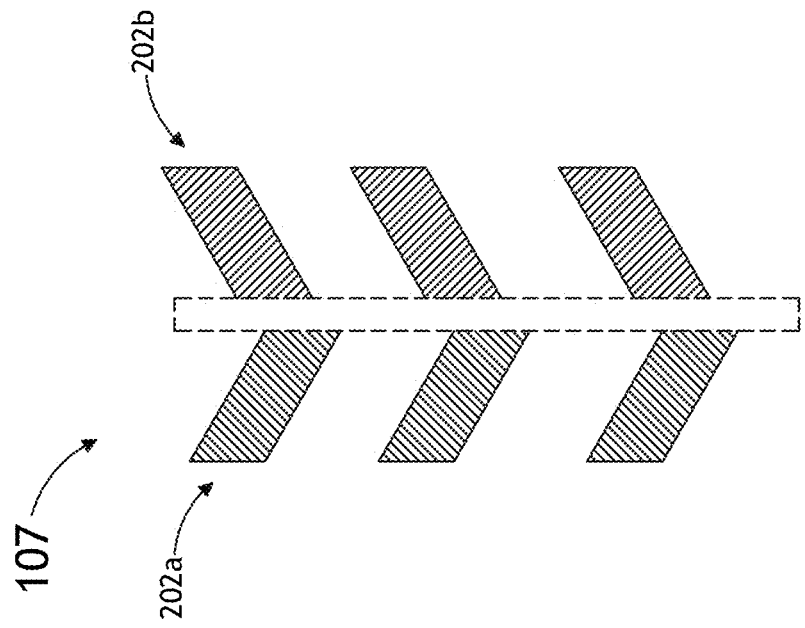
FIGS. 2A and 2B are conceptual views of a universal target including diagonal target structures suitable for use in the system for in-die metrology, in accordance with one embodiment of the present invention.
Figure 2B:
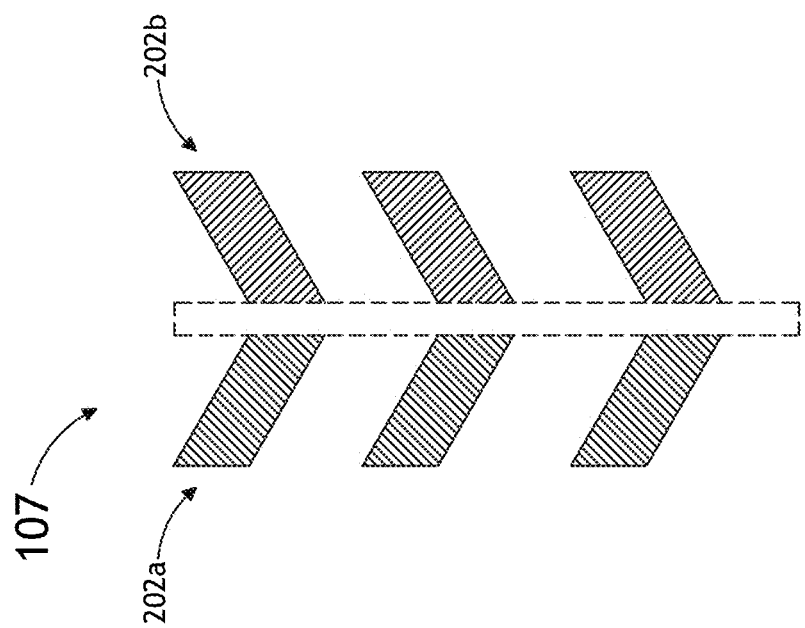

FIGS. 2A and 2B illustrate a conceptual view of diagonal configured target design for use as the universal metrology target 107, in accordance with one embodiment of the present invention. In one embodiment, the diagonal configured target includes a first target structure 202a and a second target structure 202b, both including diagonal structure elements, as shown in FIGS. 2A and 2B. It is further noted that when a shift along a direction (e.g., Y-direction as shown in FIG. 2B) occurs the shift is manifest by the relative change in position between the first structure 202a and the second structure 202b.

FIGS. 2C-2G illustrate conceptual views of a series of target designs for use as the universal metrology target 107, in accordance with some embodiments of the present invention. As shown in FIG. 2C-2G, each shaded region corresponds to a target structure 202a patterned on a first process layer, while the unfilled region corresponds to a target structure 202b patterned on a second process layer. It is noted herein that an overlay metrology tool 130 may measure relative shift between process layers by measuring the relative shift between the target structures 202a, 202b. Applicants note that the present invention is not limited to any of the embodiments provided herein, which are provided merely for illustrative purposes. It is further recognized that universal targets may consist of any combination of horizontal and/or vertical features (e.g., grating structure) suitable for measuring overlay.

It is contemplated herein that the universal targets 107 and component target structures 202a, 202b may take on a number of forms. In designing a set of targets for implementation by the present invention a number of physical characteristics may be varied or altered in order to achieve adequate performance for inspection and metrology measurement. For example, these characteristics include, but are not limited to, width, size, orientation, and shape.

Figure 3:
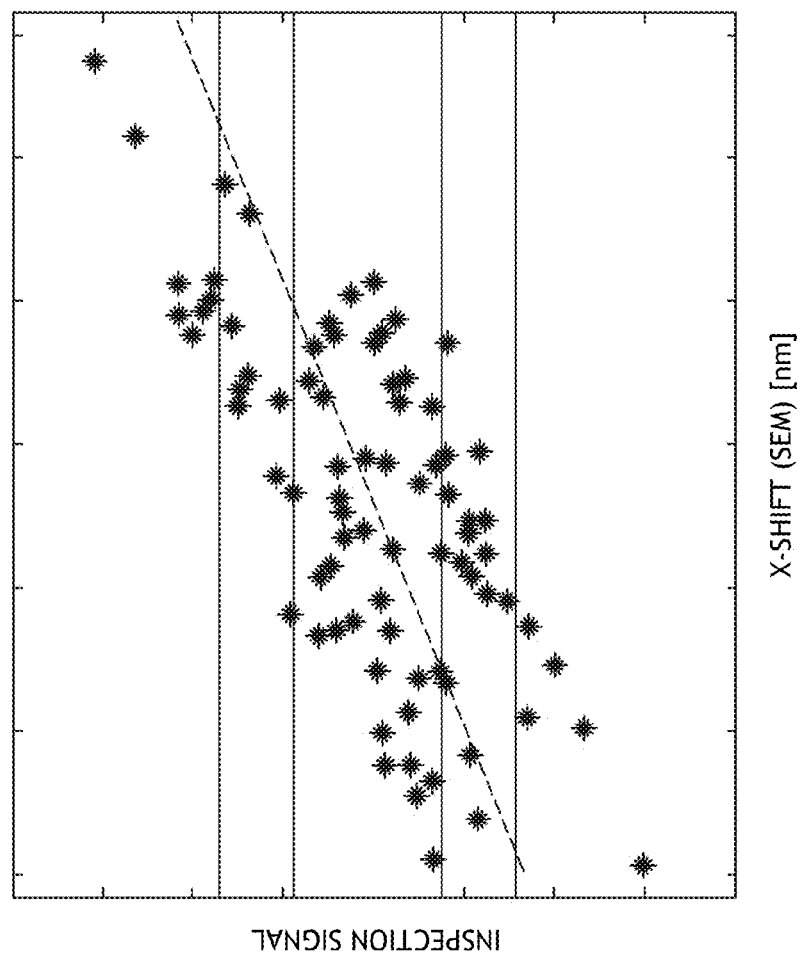
FIG. 3 illustrates a data graph depicting inspection signal intensity as a function of overlay shift in the x-direction, in accordance with one embodiment of the present invention.

FIG. 3 depicts a set of data indicative of the correlation between inspection signal and overlay error observable in the measurement of the universal target structures of the present invention. As shown in FIG. 3, the inspection signal measured by an inspection tool correlates well with overlay error (e.g., overlay error in X-direction). In this regard, the system 10 of the present invention may utilize such relationships (which may vary between tools and tool pairings) to calibrate inspection data, enabling inspection results to serve as a proxy to metrology results. It is contemplated herein that similar relationships may be built up for the case of CD metrology.

The embodiments of the system 10 illustrated in FIG. 1A-1G may be further configured as described herein. In addition, the system 100 may be configured to perform any other step(s) of any of the method embodiment(s) described herein.

The following method embodiments relate to universal target based inspection assisted metrology of one or more die of a wafer. It is generally recognized that the sub-systems 100, 120 and 130, individually or in combination, are suitable for implementing the design level, lithography level, inspection level and metrology level steps of the following embodiments. It is noted, however, the methods described below are not limited to the architecture of sub-systems 100, 120 and 130.

Figure 4:
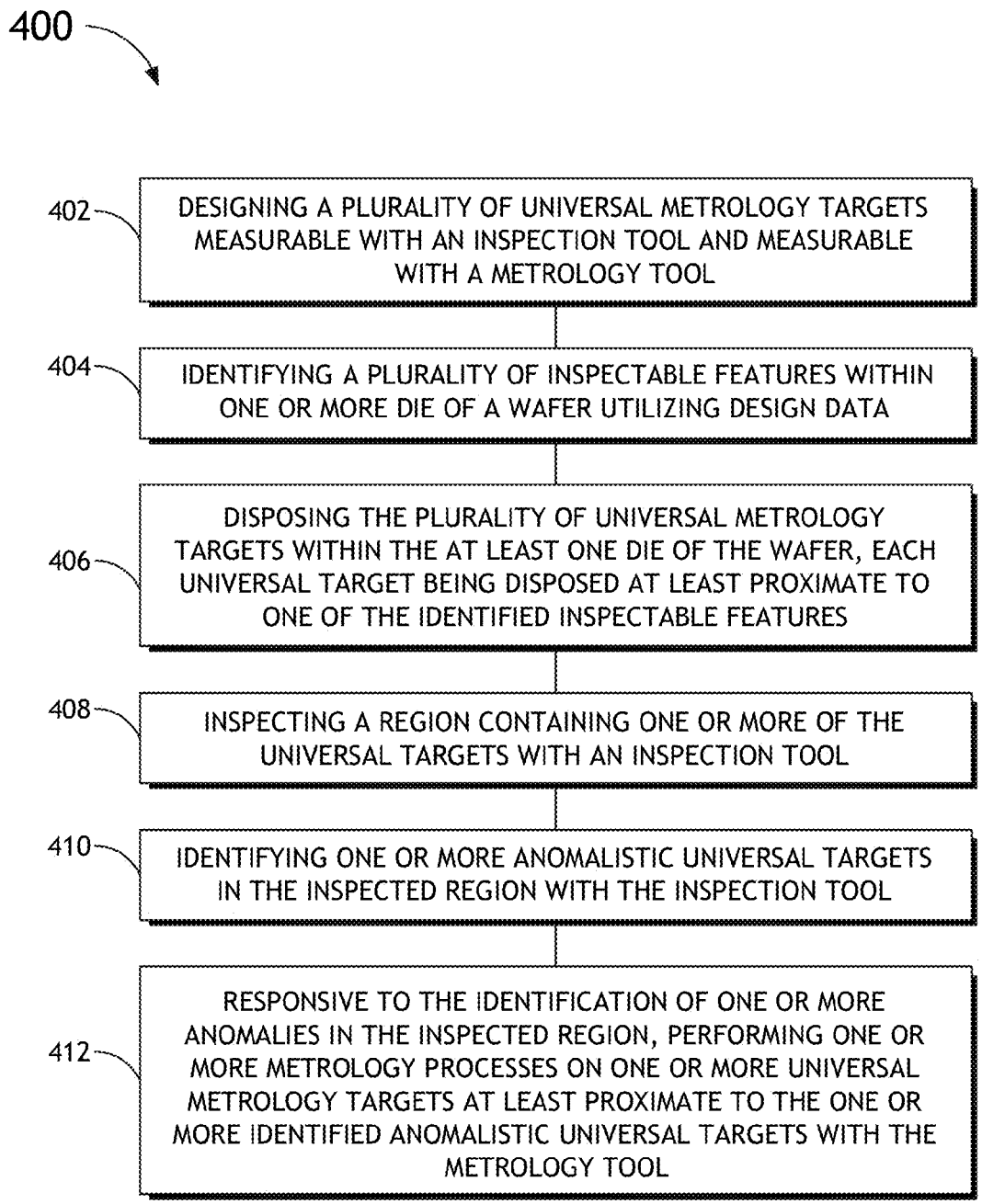
FIG. 4 illustrates a process flow diagram depicting a method universal target based inspection assisted metrology, in accordance with one embodiment of the present invention.

FIG. 4 is a flow diagram illustrating steps performed in a method 400 for universal target based inspection assisted metrology, in accordance with one embodiment of the present invention.

In a first step 402, a plurality of universal metrology targets measurable with an inspection tool and measurable with a metrology tool are designed. In this regard, the controller 101 may act to design a set of universal metrology targets based on the inspection and metrology applications of system 10. In one embodiment, the one or more processors 104 of controller 101 of lithography tool 100 execute one or more design steps to design a plurality of universal targets measurable with an inspection tool and measurable with a metrology tool (e.g., overlay metrology tool, CD metrology tool and the like). In one embodiment, the one or more processors 104 of controller 101 of lithography tool 100 execute one or more design steps to design a plurality of universal targets 107 configured to satisfy a design for manufacturability (DFM) requirement of one or more devices fabricated on the wafer 108. In another embodiment, the one or more processors 104 of controller 101 execute one or more design steps to achieve adequate (e.g., above a selected threshold level) inspection detection during run-time alignment. In another embodiment, the one or more processors 104 of controller 101 execute one or more design steps to generate a plurality of universal metrology targets configured for imaging by a scanning electron microscope (SEM).

In another embodiment, the one or more processors 104 of controller 101 execute one or more design steps to generate a plurality of universal metrology targets 107 achieving a selected device pattern density. In one embodiment, the one or more processors 104 of controller 101 execute one or more design steps to generate a plurality of universal metrology targets, wherein an arrangement of the universal targets 107 and active circuit layout of one or more devices of the wafer 108 are at or above a selected device pattern density.

In one embodiment, the one or more processors 104 of controller 101 execute one or more design steps to generate a plurality of universal metrology targets 107 measurable using an overlay metrology tool. As previously noted herein, any overlay metrology tool architecture known in the art may be adapted to operate in the method 400. In this regard, the metrology tool 131 described previously herein may be configured generally as an overlay metrology tool for measuring overlay between two or more target structures (e.g., 202a and 202b).

In another embodiment, the one or more processors 104 of controller 101 execute one or more design steps to generate a plurality of universal metrology targets 107 measurable using a CD metrology tool. As previously noted previously herein, any CD metrology tool architecture known in the art may be adapted to operate in the present invention. In this regard, the metrology tool 131 described previously herein may be configured generally as a CD metrology tool for measuring a critical dimension associated with one or more target structures (e.g., 202a and 202b). Further, when operating in a mask metrology configuration, the universal targets 107 may be designed to allow for measuring critical dimension uniformity (CDU) and registration.

It is contemplated herein that any computational system or sub-system may execute step 302. For example, the design step 302 may be executed by a stand-alone computational system (e.g., one or more processors executing program instructions stored in memory). By way of another, the design step 302 may be executed by any one of the other controllers of the present invention (e.g., controller 121, 131 or 141). By way of another, the design step 302 may be executed by an integrated controller serving to control two or more of the systems 100, 120 or 130.

In a second step 404, a plurality of inspectable features within at least one die of a wafer is identified. In one embodiment, the one or more processors 104 of controller 100 execute one or more feature identification steps in order to identify one or more inspectable features within a die 111 of a wafer 108. In one embodiment, the one or more processors 104 of controller 101 may utilize design data associated with the circuit layout of one or more devices of the wafer 108 in order to identify a set of inspectable features within on or more die of the wafer 108. In another embodiment, the one or more processors 104 of controller 101 may execute a design search of design data associated with the circuit layout of one or more devices of the wafer 108 in order to identify a set of inspectable features within on or more die of the wafer 108. In another embodiment, the one or more processors 104 of controller 101 may execute a design search of design data associated with the circuit layout of one or more devices of the wafer 108 in order search for one or more patterns in the design data that are suitable or inspection, overlay metrology and/or CD metrology. In another embodiment, the one or more processors 104 of controller 101 may utilize design data associated with the circuit layout of one or more devices of the wafer 108 in order to identify one or more spatial configurations (e.g., positions of the universal targets) within one or more die 111 at which placement of the universal targets 107 satisfies a design for manufacturability (DFM) requirement.

It is contemplated herein that any computational system or sub-system may execute step 304. For example, the feature identification step 304 may be executed by a stand-alone computational system (e.g., one or more processors executing program instructions stored in memory). By way of another, the identification step 304 may be executed by any one of the other controllers of the present invention (e.g., controller 121, 131 or 141). By way of another, the identification step 304 may be executed by an integrated controller serving to control two or more of the systems 100, 120, 130 and 140.

In a third step 406, the plurality of universal metrology targets are disposed within the at least one die of the wafer.

In one embodiment, each universal target 107 is disposed at or near one of the identified inspectable features of step 304. In one embodiment, the universal metrology target 107 are printed to the wafer 108 by exposing selected portions of the wafer resist layer to radiation In one embodiment, the lithography tool 100 may be utilized to transfer the mask pattern of mask 103 to the wafer 108. In one embodiment, the lithography tool 100 may print the plurality of designed universal metrology targets at the positions of the wafer determined in step 304. In this regard, as shown in FIGS. 1B and 1C, the lithography tool 100 may print a set of universal target structures 107 within one or more die 111 of wafer 108. In this regard, the position of each of the universal target structures 107 printed in a given die or dies is based on the identification of regions of the device features of the wafer 108 suitable for inspection. In one embodiment, the lithography tool 100 may dispose the plurality of universal metrology targets 107 and one or more active circuit elements within the at least one die 111 of the wafer 108 such that a pattern density associated with the active circuit layout of the one or more devices of the wafer is at or above a selected device pattern density.

It is noted herein that any of the target structures described in the present disclosure may be printed to the wafer 108 utilizing lithography tool 100. For instance, the lithography tool 100 is suitable for printing the target structures depicted in FIGS. 2A-2G. It is further noted, however, that the target structures depicted in FIGS. 2A-2G are provided merely for illustration and should not be interpreted as limiting. It is recognized herein that any lithography tool known in the art may be adapted for implementation in the present invention.

In a fourth step 308, a region containing one or more of the universal targets is inspected with an inspection tool. In a fifth step 310, one or more anomalistic universal targets 115 are identified in the inspected region. It is again noted herein that the universal targets 107 are designed to be sensitive to the inspection tool 120, making detection by inspection possible. For example, as shown in FIG. 1D, an inspection tool 120 may inspect region 114 containing a set of universal targets 107.

In another embodiment, the inspection tool 120 may then identify one or more anomalistic universal targets 115 (indicated with a circle in FIG. 1D). For example, the one or more processors 124 of the inspection tool 120 may execute any imaging processing algorithm known in the art (stored in memory 126) suitable for detecting anomalistic universal targets 115 (i.e., universal targets displaying a higher or lower than anticipated inspection signal intensity). It is noted herein that, as shown in FIG. 3, Applicants have shown a strong correlation between acquired inspection signal and the corresponding overlay error for a given universal target. Taking advantage of this correlation, the identification of excursions (i.e., anomalies) in the acquired inspection signals from the universal targets effectively provides for a screening of universal targets for metrology (see step 312). In addition, as discussed below, it may be utilized to calibrate inspection data with finer tuned metrology results. In one embodiment, the inspection tool 120 used to carry out the inspection of one or more universal targets contained within a selected region includes an optical inspection tool. For example, the inspection tool 120 may include a brightfield inspection tool or a darkfield inspection tool. In one embodiment, the inspection tool 120 used to carry out the inspection of one or more universal targets contained within a selected region includes an e-beam inspection tool. In another embodiment, the inspection of one or more universal targets contained within a selected region may be carried out utilizing the imaging function of a scanning electron microscope (SEM).

In a sixth step 312, one or more metrology processes are performed on one or more universal metrology targets at least proximate to the one or more identified anomalistic universal targets with the metrology tool in response to the identification of one or more anomalies in the inspected region. In one embodiment, as shown in FIG. 1A, the inspection tool 120 is communicatively coupled to the metrology tool 130. In this regard, the inspection results acquired by inspection tool 120 may be fed forward to the metrology tool 130. It is noted herein that in some embodiments the inspection tool 120 and metrology tool 130 may be integrated such that they share a controller 141, which includes processors 144 and memory 146. In other embodiments, the controller 121 of the inspection tool 120 is communicatively coupled to the controller 131 of the metrology tool 130.

In one embodiment, a metrology tool 130 may perform one or more metrology measurements on one or more of the anomalistic universal targets 115 identified in step 310. In this regard, the metrology process performed on a given wafer may be fined tuned by the pre-selection of measurement targets via that inspection and identification steps 308, 310. The inspection tool 120 may be used to inspect various regions of the wafer 108 at a higher sampling rate and when excursions, or anomalistic targets 115 are encountered, those excursions may be passed onto the metrology tool 130 for further measurement.

In one embodiment, one or more overlay metrology processes may be performed on the one or more anomalistic universal targets 115 identified in the inspected region. It is noted herein that any overlay metrology tool known in the art is adaptable to the present invention. In one embodiment, one or more CD metrology processes may be performed on the one or more anomalistic universal targets 115 identified in the inspected region. It is noted herein that any CD metrology tool known in the art is adaptable to the present invention. In another embodiment, one or more overlay metrology processes may be performed on the one or more anomalistic universal targets 115 identified in the inspected region using an imaging mode of a scanning electron microscope to measure the relative shift between two or more target structures of an anomalistic target 115.

In a further step, one or more inspection results of one or more universal target structures may be calibrated with one or more results of the performed one or more metrology processes. In this regard, the results of the metrology processes performed on the anomalistic and non-anomalistic universal targets may be utilized to calibrate the inspection signal acquired from the anomalistic and non-anomalistic universal targets. Calibration of the inspection signal may allow for refined overlay detection utilizing higher faster, but generally less accurate, inspection via an inspection tool 120. In this regard, the metrology results may serve as a calibration anchor for higher density, but less accurate, inspection data. Then, based on the calibrated high density inspection data, which serves as a proxy to directly measured overlay, an overlay map may be generated for the one or more die of the wafer 108. FIG. 3 illustrates an example of inspection signal as a function of the relative shift between target structures of a set of universal targets. Data similar to, but not limited to, that observed in FIG. 3 may be utilized to calibrate the inspection system 120.

While the present disclosure has focused on the inspection and detection of anomalistic target structures on the wafer 108, it is contemplated herein that this process may be extended to mask inspection. In this regard, mask registration metrology and mask inspection equipment may be used to create high spatial frequency, accurate maps of mask registration. In a further embodiment, the mask inspection/metrology results may be analyzed in concert with the high frequency overlay measurements described above. In a further embodiment, the application of the above process to the wafer and the mask allows for the separation of the two principle components of overlay error, namely mask misregistration and scanner misalignment.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A method for in-die metrology comprising:
designing a plurality of universal metrology targets, wherein at least some of the universal metrology targets are measurable with a metrology tool and an inspection tool;
identifying a plurality of inspectable features within at least one die of a wafer using design data;
disposing the plurality of universal targets within the at least one die of the wafer, each universal target being disposed at least proximate to one of the identified inspectable features;
inspecting a region containing one or more of the universal targets with an inspection tool;
identifying one or more anomalistic universal metrology targets in the inspected region with an inspection tool, wherein the one or more anomalistic universal metrology targets display an inspection parameter outside a selected inspection parameter range; and
responsive to the identification of one or more anomalistic universal metrology targets in the inspected region with the inspection tool, performing one or more metrology processes on the one or more anomalistic universal metrology targets with the metrology tool.

2. The method of claim 1, further comprising:
calibrating one or more inspection results of one or more universal metrology target structures with one or more results of the performed one or more metrology processes.

3. A system for in-die metrology comprising:
a lithography tool configured to:
design a plurality of universal metrology targets, wherein at least some of the universal metrology targets are measurable with a metrology tool and an inspection tool;
identify a plurality of inspectable features within at least one die of a wafer using design data; and
dispose the plurality of universal targets within the at least one die of the wafer, each universal target being disposed at least proximate to one of the identified inspectable features;
an inspection tool configured to:
inspect a region containing one or more of the universal targets; and
identify one or more anomalistic universal targets in the inspected region with an inspection tool, wherein the one or more anomalistic universal metrology targets display an inspection parameter outside a selected inspection parameter range; and
a metrology tool configured to perform one or more metrology processes on the one or more anomalistic universal metrology targets in response to the identification of one or more anomalistic universal metrology targets in the inspected region with the inspection tool, wherein the lithography tool, the inspection tool and the metrology tool are communicatively coupled to a controller.

4. The system of claim 3, wherein the lithography tool is configured to design a plurality of universal metrology targets configured to satisfy a design for manufacturability (DFM) requirement of one or more devices fabricated on the wafer.

5. The system of claim 3, wherein the lithography tool is configured to design a plurality of universal metrology targets, wherein an arrangement of plurality of universal targets and active circuit layout of one or more devices of the wafer are at or above a selected device pattern density.

6. The system of claim 3, wherein the wherein the lithography tool is configured to design a plurality of universal metrology targets configured to generate inspection detection during run-time alignment at or above a selected threshold level.

7. The system of claim 3, wherein the lithography tool is configured to design a plurality of universal metrology targets configured for imaging by a scanning electron microscope.

8. The system of claim 3, wherein the wherein the lithography tool is configured to identify a plurality of inspectable features within at least one die of a wafer with a design search of one or more sets of design data associated with the one or more devices of the wafer.

9. The system of claim 3, wherein the lithography tool is configured to lithographically print the plurality of universal metrology targets within the at least one die of the wafer with a lithography tool.

10. The system of claim 3, wherein the lithography tool is configured to dispose the plurality of universal metrology targets and one or more active circuit elements within the at least one die of the wafer such that a pattern density associated with the active circuit layout of the one or more devices of the wafer is above a selected device pattern density.

11. The system of claim 3, wherein the lithography tool is configured to dispose a plurality of universal metrology targets within the die of a wafer at a plurality of positions in compliance with one or more design of manufacturability requirements associated with one or more devices of the wafer.

12. The system of claim 3, wherein at least one of the plurality of universal targets comprises:
a first metrology target structure disposed on a first process layer; and
at least a second metrology target disposed on a second process layer, wherein a shift along at least one direction between the first metrology target structure and the at least a second metrology target structure is measurable by the metrology tool.

13. The system of claim 12, wherein at least one of the plurality of universal targets comprises:
a first metrology target structure including a set of diagonal target structure elements; and
at least a second metrology target structure including a set of diagonal target structure elements, wherein a shift along at least one direction between the first metrology target structure and the at least a second metrology target structure is measurable by the metrology tool.

14. The system of claim 12, wherein at least one of the plurality of universal targets comprises:
a first metrology target structure disposed on a first process layer having a first size; and
at least a second metrology target disposed on a second process layer having a second size different than the first size, wherein a shift along at least one direction between the first metrology target structure and the at least a second metrology target structure is measurable by the metrology tool.

15. The system of claim 12, wherein at least one of the plurality of universal targets comprises:
a first metrology target structure disposed on a first process layer having a first shape; and
at least a second metrology target disposed on a second process layer having a second shape different than the first size, wherein a shift along at least one direction between the first metrology target structure and the at least a second metrology target structure is measurable by the metrology tool.

16. The system of claim 3, wherein at least one of the plurality of universal targets comprises:
a first metrology target structure disposed on a process layer; and
at least a second metrology target disposed on the process layer, wherein a size difference between the first metrology target structure and the at least a second metrology target structure is measurable by the metrology tool.

17. The system of claim 3, wherein at least one of the plurality of universal targets comprises:
a first metrology target structure disposed on a process layer; and
at least a second metrology target disposed on the process layer, wherein a position difference between the first metrology target structure and the at least a second metrology target structure is measurable by the metrology tool.

18. The system of claim 3, wherein at least one of the size and shape of the region is selected for the inspection tool to achieve inspection sensitivity at or above a selected level.

19. The system of claim 3, wherein the inspection tool comprises:
an optical inspection tool.

20. The system of claim 3, wherein the inspection tool comprises:
an electron beam inspection tool.

21. The system of claim 3, wherein the inspection tool comprises:
a scanning electron microscope (SEM).

22. The system of claim 1, wherein the inspection tool is configured to identify one or more anomalistic inspection signals from one or more of the plurality of universal targets in the inspected region.

23. The system of claim 3, wherein the metrology tool comprises:
an overlay metrology tool.

24. The system of claim 3, wherein the metrology tool comprises:
a critical dimension metrology tool.

25. The system of claim 3, wherein the wherein the metrology tool comprises:
a scanning electron microscope.

* * * * *